(12) United States Patent
Robl et al.

(10) Patent No.: US 11,309,654 B2
(45) Date of Patent: Apr. 19, 2022

(54) FIELD DEVICE WITH ELECTRONIC MODULE INCLUDING COVER

(71) Applicant: Endress+Hauser Conducta GmbH+Co. KG, Gerlingen (DE)

(72) Inventors: Stefan Robl, Hünxe (DE); Michael Dieterich, Waiblingen (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 0 days.

(21) Appl. No.: 17/076,271

(22) Filed: Oct. 21, 2020

(65) Prior Publication Data

US 2021/0126396 A1    Apr. 29, 2021

(30) Foreign Application Priority Data

Oct. 23, 2019   (DE) ..................... 10 2019 128 623.9

(51) Int. Cl.
| | |
|---|---|
| *H01R 13/453* | (2006.01) |
| *H01R 13/58* | (2006.01) |
| *H01R 13/639* | (2006.01) |
| *H01R 13/46* | (2006.01) |

(52) U.S. Cl.
CPC ......... *H01R 13/4534* (2013.01); *H01R 13/46* (2013.01); *H01R 13/5812* (2013.01); *H01R 13/639* (2013.01)

(58) Field of Classification Search
None
See application file for complete search history.

(56) References Cited

U.S. PATENT DOCUMENTS

| | | | |
|---|---|---|---|
| 4,424,407 A * | 1/1984 | Barbie ................ | H01R 13/447 174/67 |
| 5,756,937 A | 5/1998 | Gleadall | |
| 7,056,145 B2 * | 6/2006 | Campbell, III .... | H01R 13/6395 174/67 |
| 2005/0202709 A1 | 9/2005 | Cambell, III et al. | |

(Continued)

FOREIGN PATENT DOCUMENTS

| | | |
|---|---|---|
| CN | 105594071 A | 5/2016 |
| CN | 105659443 A | 6/2016 |
| DE | 102013111696 A1 | 4/2015 |

(Continued)

*Primary Examiner* — Ross N Gushi
(74) *Attorney, Agent, or Firm* — Mark A. Logan; Endress+Hauser (USA) Holding Inc.

(57) ABSTRACT

A field device includes an electronic module with a first electrical terminal, a first electrical plug with a cable clamp for receiving a cable core, wherein the first electrical plug is adapted to be detachably connected to the first electrical terminal of the electronic module, and a cover with a clamping element. A fastening device fastens the cover to the electronic module, with the cover being designed in a way that when the cover is fastened to the electronic module by the fastening device and the first electrical plug is connected to the first electrical terminal of the electronic module, the cover, together with the electronic module, forms a first chamber and encloses the first electrical plug in the first chamber, wherein the clamping element is arranged in a way that the clamping element prevents the first electrical plug from detaching from the first electrical terminal of the electronic module.

9 Claims, 3 Drawing Sheets

(56) References Cited

U.S. PATENT DOCUMENTS

2006/0180333 A1\* 8/2006 Rodrigues .............. H02G 15/10
174/66

FOREIGN PATENT DOCUMENTS

| DE | 102014011084 A1 | 2/2016 |
|---|---|---|
| EP | 2515380 A1 | 10/2012 |
| WO | 2015061202 A1 | 4/2015 |

\* cited by examiner

FIELD DEVICE WITH ELECTRONIC MODULE INCLUDING COVER

CROSS-REFERENCE TO RELATED APPLICATION

The present application is related to and claims the priority benefit of German Patent Application No. 10 2019 128 623.9, filed on Oct. 23, 2019, the entire contents of which are incorporated herein by reference.

TECHNICAL FIELD

The present disclosure relates to a field device with an electronic module including cover.

BACKGROUND

Field devices are used in process systems to receive data signals from a sensor or a control station, to process them, and to forward them to a control station or a sensor. For this reason, field devices are also called transmitters.

Electronic components, such as current-carrying cables or fuses, are accommodated in the field device. During the operating time of the field device, a user may need access to the interior of the field device for various reasons: for example, when the field device is mounted on a holder, when additional electronic components are mounted in the interior of the field device, when the field device is routinely serviced, or when the field device is being repaired. When accessing the interior of the field device, the user must be protected from current-carrying components. This so-called protection against contact is regulated in DIN EN 60529 and must be implemented in the interior of the field device.

In addition, inputs and outputs of electrical assemblies must be separated from each other by a safety distance in order to prevent "arcing". This so-called thread measure is regulated in the IEC60079 standard and must also be satisfied in the interior of the field device. The IEC60079 standard also describes a minimum force that must be applied before an electrical plug can be pulled out of its contacts. Thus, if a force that is weaker than this pull-out force is used to pull on the electrical lines of a plug, the plug must not detach from the associated socket.

In the prior art, e.g., in EP 2 515 380 A1, a field device with a cover is known for complying with the IEC/EN 60079-11 standard.

However, this prior art has the disadvantage that electrical connectors covered by the cover are not optimally protected or secured against undesired interactions between the electrical connectors and/or the user.

SUMMARY

It is therefore an object of the present disclosure to provide a field device with optimum protection of the electrical connectors.

The field device according to the present disclosure comprises an electronic module with a first electrical terminal, a first electrical plug with a cable clamp for receiving a cable core, a cover with a clamping element, and a fastening device for fastening the cover to the electronic module. The first electrical plug is adapted to be detachably connected to the first electrical terminal of the electronic module. The cover is designed in such a way that when the cover is fastened to the electronic module by the fastening device and the first electrical plug is connected to the first electrical terminal of the electronic module, the cover, together with the electronic module, forms a first chamber and encloses the first electrical plug in the first chamber. The clamping element prevents the first electrical plug from detaching from the first electrical terminal of the electronic module.

The field device according to the present disclosure makes it possible that when the cover is fastened to the electronic module the plug cannot be loosened or detached from the electronic module. As a result of unintentionally detaching plug connectors, spark formation could, for example, occur or detaching cable cores could cause undesired short circuits with other electrical terminals nearby, which is however prevented by the cover. The plug is also protected against detaching from the first electrical terminal of the electronic module as a result of vibrations, for example. In addition, the cover allows electrical connectors to be separated from one another, which is necessary within the scope of the IEC60079 standard, such as between inputs and outputs of the field device. This standard-compliant separation between inputs and outputs by an adequate distance between the associated electrical terminals can be achieved by the cover itself even in the case of very restricted space conditions in the field device.

According to an embodiment of the present disclosure, the first electrical terminal and the first electrical plug are designed in such a way that the first electrical plug is adapted to be detachably connected to the first electrical terminal along a first axis. The first electrical plug comprises a clamping surface that extends substantially in a plane transverse to the first axis. The clamping element is designed in such a way that when the cover is fastened to the electronic module by the fastening device and the first electrical plug is connected to the first electrical terminal of the electronic module, the clamping element is arranged in relation to the clamping surface in such a way that the clamping element prevents the first electrical plug from detaching from the first electrical terminal of the electronic module.

According to an embodiment of the present disclosure, the field device furthermore comprises a housing with a housing wall. The housing wall has a first cable opening. The electronic module is fastened in the housing. The cover has a second cable opening and is designed in such a way that when the cover is fastened to the electronic module by the fastening device and the first electrical plug is connected to the first electrical terminal of the electronic module, the cover is arranged on the housing wall in such a way that the first cable opening of the housing wall and the cover form a cable duct from the first cable opening of the housing wall to the first electrical plug.

According to an embodiment of the present disclosure, the field device furthermore comprises a positioning aid. The positioning aid is formed by a first tongue-and-groove connecting element of the cover and a second tongue-and-groove connecting element of the electronic module complementary to the first tongue-and-groove connecting element of the cover.

According to an embodiment of the present disclosure, the field device furthermore comprises an orientation aid. The orientation aid is designed in such a way that when the cover is fastened to the electronic module by the fastening device, the cover covers the orientation aid. The orientation aid is, for example, a colored imprint, a colored sticker, or a relief.

According to an embodiment of the present disclosure, the cover comprises a transparent region. The transparent region extends in such a way that when the cover is fastened to the electronic module by the fastening device and the first electrical plug is connected to the first electrical terminal of the electronic module, at least the cable clamp of the first electrical plug is visible. The transparent region preferably extends over the entire cover.

According to an embodiment of the present disclosure, the fastening device comprises a screw, a through-opening in the cover, and a thread in the electronic module.

According to an embodiment of the present disclosure, the screw comprises a threaded portion with an external thread between the screw tip and the screw head and a sliding portion located between the threaded portion and the screw head. The screw has a smaller diameter in the sliding portion than in the threaded portion. In the cover, the through-opening has an internal thread complementary to the external thread of the screw.

According to an embodiment of the present disclosure, the fastening device comprises an elastic hook and a hook opening complementary to the elastic hook. The cover comprises the elastic hook, and the electronic module comprises the hook opening. Alternatively, the cover comprises the hook opening, and the electronic module comprises the elastic hook.

According to an embodiment of the present disclosure, the field device furthermore comprises a second electrical plug with a cable clamp for receiving a cable core. The second electrical plug is adapted to be detachably connected to a second electrical terminal of the electronic module. The cover has at least one partition. The partition is arranged in such a way that when the cover is fastened to the electronic module by the fastening device and the second electrical plug is connected to the second electrical terminal of the electronic module, the cover, together with the electronic module, forms a first chamber and encloses the first electrical plug in the first chamber and also forms a second chamber and encloses the second electrical plug in the second chamber. The first chamber is separated from the second chamber by the partition. The clamping element is arranged in such a way that the clamping element prevents the second electrical plug from detaching from the second electrical terminal of the electronic module.

According to an embodiment of the present disclosure, the cover is designed in such a way that into the cover has a text and/or pictograms. The text and/or the pictograms are formed by means of laser marking, engraving, pad printing, or by the production method.

BRIEF DESCRIPTION OF THE DRAWINGS

The present disclosure is explained in more detail on the basis of the following description of the figures. The following are shown.

DETAILED DESCRIPTION

Figure 1:
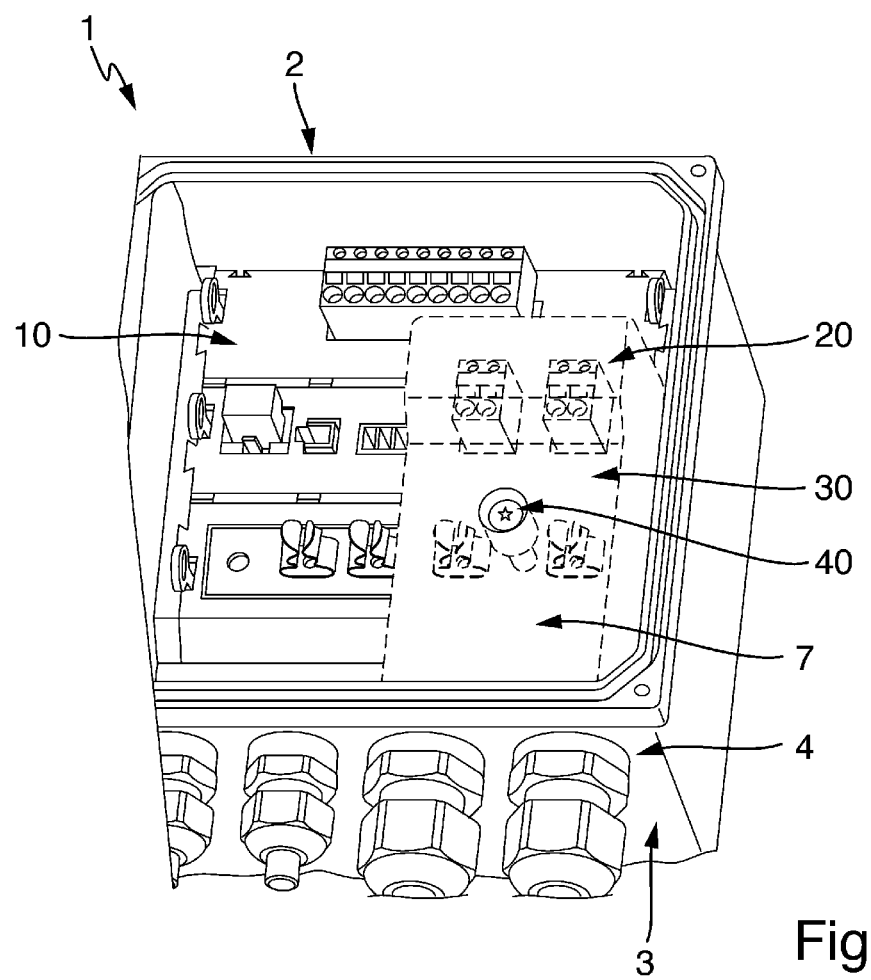
FIG. 1 shows a perspective view of a field device according to the present disclosure with cover.

FIG. 1 shows a field device 1 according to the present disclosure. The field device 1 comprises an electronic module 10, a first electrical plug 20, a cover 30, and a fastening device 40 for fastening the cover 30 to the electronic module 10.

Figure 2:
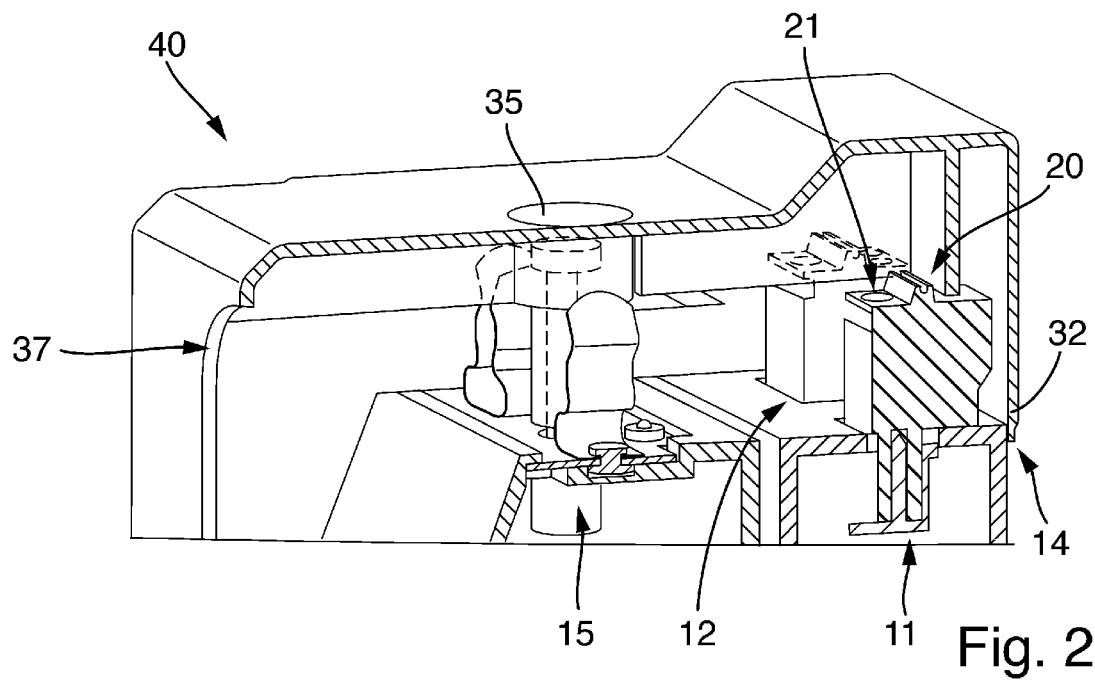
FIG. 2 shows a detailed section of the field device of FIG. 1.

The electronic module 10 comprises a first electrical terminal 11 and a second electrical terminal 12 (see FIG. 2). In addition, the electronic module 10 may comprise other different electrical components, such as fuses, plugs, cables, boards, and similar components. The first electrical terminal 11 and the second electrical terminal 12 are arranged at a suitable distance from each other in such a way that the cover 30 is adapted to cover at least one electrical terminal 11 or 12.

Figure 3:
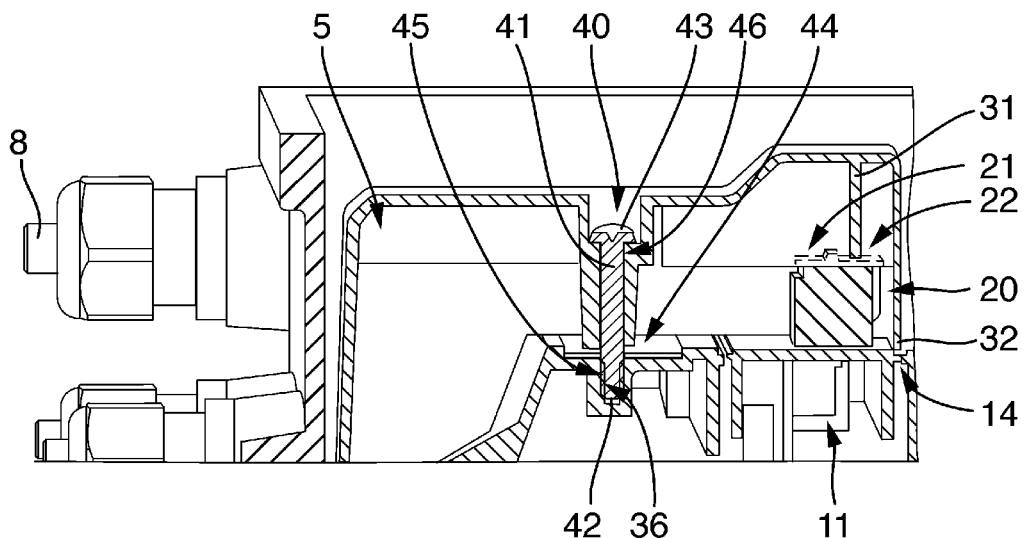
FIG. 3 shows a side view of the cover of FIG. 1.

FIG. 3 shows the first electrical plug 20 in detail. The electrical plug 20 comprises a cable clamp 21 for receiving a cable core 8. The first electrical plug 20 is adapted to be detachably connected to the first electrical terminal 11 of the electronic module 10. For example, the first electrical plug 20 and the first electrical terminal 11 are designed in such a way that the first electrical plug 20 can be plugged into the first electrical terminal 11, e.g., along a first axis Y (see FIG. 3).

In one embodiment, the first electrical plug 20 has a clamping surface 22. The clamping surface 22 extends substantially in a plane transverse to the first axis Y. The clamping surface 22 is adapted to come into contact with a clamping element 31 of the cover 30. In an alternative embodiment not shown, the clamping surface 22 is not arranged transversely to the first axis Y.

FIG. 3 shows the cover 30 with the clamping element 31. The clamping element 31 is designed in such a way that when the cover 30 is connected to the electronic module 10, the first electrical plug 20 cannot be moved in its plug-in direction within the first electrical terminal 11 or the first electrical plug 20 is prevented from detaching from the first electrical terminal 11 of the electronic module 10.

The clamping element 31 is designed in such a way that when the cover 30 is fastened to the electronic module 10 by the fastening device 40 and the first electrical plug 20 is connected to the first electrical terminal 11 of the electronic module 10, the clamping element 31 is arranged in relation to the clamping surface 22 in such a way that the clamping element 31 prevents the first electrical plug 20 from detaching from the first electrical terminal 11 of the electronic module 10. The clamping element 31 is implemented directly by means of the geometry of the cover 30—as a wall, for example. In an alternative embodiment, the clamping element 31 is made of an elastic material, e.g., rubber.

The advantage of the clamping surface 22 of the plug 20 is that a bearing surface is thus dedicated to the clamping element 31 of the cover 30, as a result of which the clamping element 31 is prevented from bearing on the cable core 8 or other undesired bearing areas of the plug 20.

The cover 30 is designed in such a way that when the cover 30 is fastened to the electronic module 10 by the fastening device 40 and the first electrical plug 20 is connected to the first electrical terminal 11 of the electronic module 10, the cover 30, together with the electronic module 10, forms a first chamber 5 and encloses the first electrical plug 20 in the first chamber 5. An advantage of the cover 30 is that plug types may be used that do not require screwing into or other additional latching with the electronic unit 10. Space can thus be saved on both sides of the plug 20, for example; in addition, the assembly effort on the part of the user is reduced.

In the embodiment shown in FIGS. 1 to 3, the fastening device 40 is a screw-like fastening device. A screw-like fastening device has the advantage that standard tools, e.g., a screwdriver, can be used to detach the cover 30 from the electronic module 10. The necessity of using a suitable tool (e.g., screwdriver) additionally raises the necessary hurdle for intervention, which prevents an unintentional changing of the plug connections.

In the embodiment shown in FIG. 2, the fastening device 40 comprises a screw, and the cover 30 comprises a through-opening 35 for passing through the thread of the screw. The electronic module 10 also comprises a thread 15 for receiving the screw.

In the embodiment shown in FIG. 3, the fastening device 40 comprises a screw 41 with a screw tip 42, a screw head 43, and a threaded portion 44, arranged between the screw tip 42 and the screw head 43, with an external thread 45. The screw 41 also comprises a sliding portion 46 between the threaded portion 44 and the screw head 43. The screw 41 has a smaller diameter in the sliding portion 46 than in the threaded portion 44. For example, the sliding portion 46 is unthreaded. In this embodiment, the through-opening 35 in the cover 30 also comprises an internal thread 36 complementary to the external thread 45 of the screw 41. The thread 15 of the electronic module is also complementary to the external thread 45 of the screw 41. It is thus possible to detach the screw 41 from the thread 15 of the electronic module 10 without the screw 41 detaching from the cover 30. The screw 41 therefore cannot be lost when the cover 30 is removed from the electronic module 10. In order to detach the screw 41, the screw 41 must first be turned through the internal thread 36 of the through-opening 35 of the cover 30.

Figure 5:
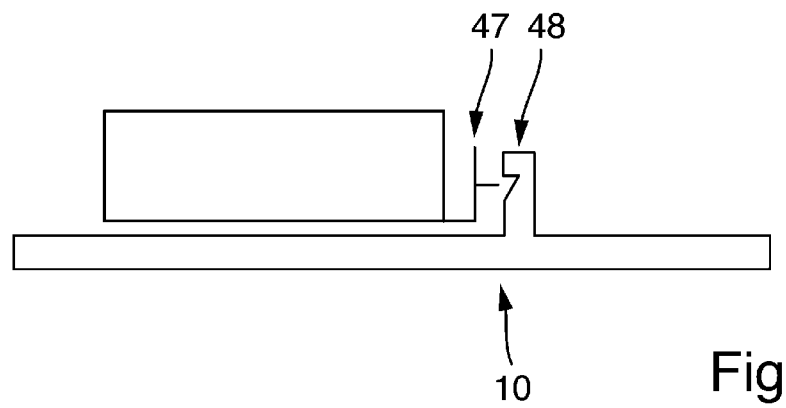
FIG. 5 shows a schematic side view of an embodiment of the cover and of the electronic module.

As shown in FIG. 5, the fastening device 40 comprises a hook-like fastening device as an alternative or in addition to the screw-like fastening device. In the hook-like fastening device, the fastening device 40 comprises an elastic hook 47 and a hook opening 48 complementary to the elastic hook 47. For example, the cover 30 comprises the elastic hook 47, and the electronic module 10 comprises the hook opening 48. In an alternative embodiment, the cover 30 comprises the hook opening 48, and the electronic module 10 comprises the elastic hook 47. An advantage of the hook-like fastening device is that no tool needs to be used since the hook-like fastening device is adapted to be manually detached or fastened by the user. A rapid and simple detachment, and thus a simple handling of the cover 30, is thus also possible.

In an embodiment compatible with the embodiment described above, the field device 1 comprises a housing 2 with a housing wall 3. The housing wall 3 comprises a first cable opening 4. In this embodiment the electronic module 10 is fastened in the housing 2. In this embodiment, the cover 30 has a second cable opening 37. The first cable opening 4 and the second cable opening 37 are designed in such a way that when the cover 30 is fastened to the electronic module 10 by the fastening device 40 and the first electrical plug 20 is connected to the first electrical terminal 11 of the electronic module 10, the cover 30 is arranged on the housing wall 3 in such a way that the first cable opening 4 of the housing wall 3 and the cover 30 form the cable duct 7 from the first cable opening 4 of the housing wall 3 to the first electrical plug 20. This makes it possible for the field device 1 to be adapted to guide a cable or a cable core 8 from outside the field device 1 into the field device 1 through the first cable opening 4 of the housing wall 3 to the first electrical plug 20 without the cable or cable core 8 being able to be touched in the field device 1 by a user. Optimal protection against pulling on the cable core 8 or touching a cable core not connected to the first electrical plug 20 is thus given. In other words, safe cable routing in the field device is guaranteed.

Ideally, the cover 30 contacts the housing wall 3. The cable duct 7 comprises the first cable opening 4 in the housing wall 3, the second cable opening 37 of the cover 30, and the first chamber 5 formed by the cover 30 together with the electronic module 10.

In the embodiment of the field device 1 shown in FIG. 2 and FIG. 3, the field device 1 furthermore comprises a positioning aid 50. The positioning aid 50 comprises a first tongue-and-groove connecting element 32 of the cover 30 and a second tongue-and-groove connecting element 14 of the electronic module 10 complementary to the first tongue-and-groove connecting element 32 of the cover 30. The first tongue-and-groove connecting element 32 is designed in such a way that the first tongue-and-groove connecting element 32 engages the second tongue-and-groove connecting element 14 of the electronic module 10 when the cover 20 is placed onto the electronic module 10 (see FIG. 3). The first tongue-and-groove connecting element 32 is designed, for example, as a groove, and the second tongue-and-groove connecting element 14 is designed, for example, as a tongue. In an alternative variant, the second tongue-and-groove connecting element 14 is designed, for example, as a groove, and the first tongue-and-groove connecting element 32 is designed, for example, as a tongue. Due to the positioning aid, easy assembly of the cover 30 is possible since no twisting of the cover is possible during mounting, e.g., when tightening the screw-like fastening device.

Figure 6:
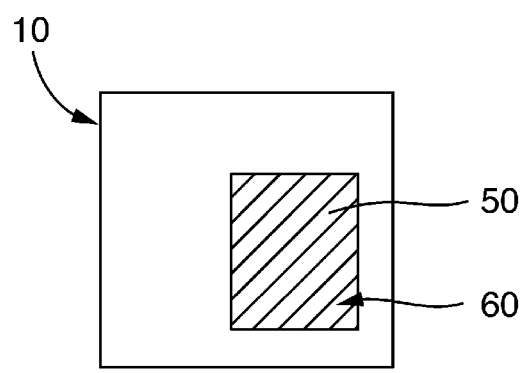
FIG. 6 shows a schematic view of the electronic module.

In the embodiment, illustrated in FIG. 6, of the field device 1, which is compatible with all described embodiments, the field device 1 furthermore comprises an orientation aid 60. The orientation aid 60 is designed in such a way that when the cover 30 is fastened to the electronic module 10 by the fastening device 40, the cover 30 covers the orientation aid 60. The orientation aid 60 is, for example, a colored imprint, a colored sticker, or a relief. The relief is integrated, for example, in the electronic module 10. Ideally, the orientation aid 60 has the same size as the cover 30 so that when the cover 30 is fastened to the electronic module 30, the orientation aid 60 is completely covered by the cover 30. The orientation aid 60 allows the user to use the cover 30 quickly and intuitively, because the visual marking of the region in which the cover 30 is to be mounted makes it easy for the user to see where to attach the cover 30 after removal or before retrofitting with a cover 30.

In one embodiment compatible with all described embodiments, the cover 30 comprises a transparent region 33. The transparent region 33 extends in such a way that when the cover 30 is fastened to the electronic module 10 by the fastening device 40 and the first electrical plug 20 is connected to the first electrical terminal 11 of the electronic module 10, at least the cable clamp 21 of the first electrical plug 20 is visible. The transparent region 33 preferably extends over the entire cover 30. Thanks to the transparent region 33, a user can immediately see whether the cable core 8 arranged under the cover 30 is correctly connected to the first electrical plug 20. If the entire cover 30, or at least all regions of the cover 30 visible to the user, are designed to be transparent, this allows the user a good overview of all electrical components underneath the cover 30, as a result of which the user is given an immediate overview of the wiring of the field device 1 without having to first remove the cover 30, for example.

Figure 4:
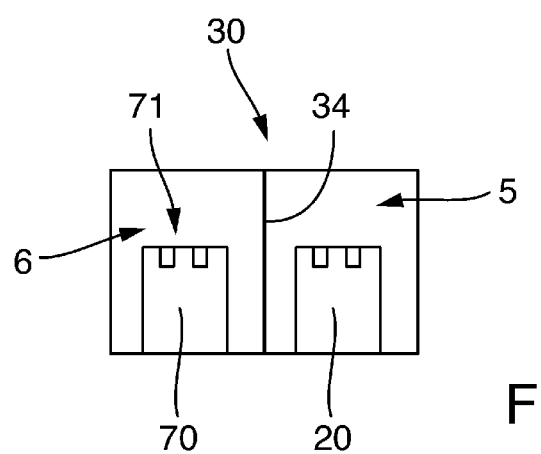
FIG. 4 shows a schematic side view of an embodiment of the cover.

As shown in FIG. 4, in one embodiment compatible with all described embodiments, the field device 1 furthermore comprises a second electrical plug 70 with a cable clamp 71 for receiving another cable core.

The second electrical plug 70 is adapted to be detachably connected to the second electrical terminal 12 of the electronic module 10. In this embodiment, the cover 30 comprises at least one partition 34 (see FIG. 4). The partition 34 is arranged in such a way that when the cover 30 is fastened to the electronic module 10 by the fastening device 40 and the second electrical plug 70 is connected to the second electrical terminal 12 of the electronic module 10, the cover 30, together with the electronic module 10, forms a first chamber 5 and encloses the first electrical plug 20 in the first chamber 5 and also forms a second chamber 6 and encloses the second electrical plug 70 in the second chamber 6, wherein the first chamber 5 are separated from the second chamber 6 by the partition 34.

The clamping element 31 is arranged in such a way that the clamping element 31 prevents the second electrical plug 70 from detaching from the second electrical terminal 12 of the electronic module 10. Naturally, the cover 30 may have any number of partitions in order to form any number of chambers, as a result of which any number of plugs can be covered separately. The partition extends to the electronic module 10 so that no cable core can be guided between the chambers 5, 6 when the cover 30 is connected to the electronic unit 10.

In one embodiment, the cover 30 is designed in such a way that into the cover 30 has a text and/or pictograms. The text and/or the pictograms are formed by means of laser marking, engraving, pad printing, or by the production method.

The invention claimed is:

1. A process automation field device, comprising:
an electronic module with a first electrical terminal;
a first electrical plug with a cable clamp for receiving a cable core, wherein the first electrical plug is adapted to be detachably connected to the first electrical terminal of the electronic module;
a cover with a clamping element; and
a fastening device including a screw, a through-opening in the cover, and a thread in the electronic module for fastening the cover to the electronic module, wherein the screw comprises a threaded portion with an external thread between the screw tip and the screw head and a sliding portion located between the threaded portion and the screw head, wherein the screw has a smaller diameter in the sliding portion than in the threaded portion, and wherein the through-opening in the cover comprises an internal thread complementary to the external thread of the screw,
wherein the cover is designed in such a way that when the cover is fastened to the electronic module by the fastening device and the first electrical plug is connected to the first electrical terminal of the electronic module, the cover, together with the electronic module, forms a first chamber and encloses the first electrical plug in the first chamber, and
wherein the clamping element is arranged in such a way that the clamping element prevents the first electrical plug from detaching from the first electrical terminal of the electronic module.

2. The process automation field device of claim 1, wherein the first electrical terminal and the first electrical plug are designed in such a way that the first electrical plug is adapted to be detachably connected to the first electrical terminal along a first axis,
wherein the first electrical plug comprises a clamping surface that extends substantially in a plane transverse to the first axis,
wherein the clamping element is designed in such a way that when the cover is fastened to the electronic module by the fastening device and the first electrical plug is connected to the first electrical terminal of the electronic module, the clamping element is arranged in relation to the clamping surface in such a way that the clamping element prevents the first electrical plug from detaching from the first electrical terminal of the electronic module.

3. The process automation field device of claim 1, wherein the field device further comprises a housing with a housing wall,
wherein the housing wall has a first cable opening and the electronic module is fastened in the housing,
wherein the cover has a second cable opening and is designed in such a way that when the cover is fastened to the electronic module by the fastening device and the first electrical plug is connected to the first electrical terminal of the electronic module, the cover is arranged on the housing wall in such a way that the first cable opening of the housing wall and the cover form a cable duct from the first cable opening of the housing wall to the first electrical plug.

4. The process automation field device of claim 1, wherein the field device further comprises a positioning aid,
wherein the positioning aid is formed by a first tongue-and-groove connecting element of the cover and a second tongue-and-groove connecting element of the electronic module complementary to the first tongue-and-groove connecting element of the cover.

5. The process automation field device of claim 1, wherein the field device further comprises an orientation aid,
wherein the orientation aid is designed in such a way that when the cover is fastened to the electronic module by the fastening device, the cover covers the orientation aid,
wherein the orientation aid is a colored imprint, a colored sticker, or a relief.

6. The process automation field device of claim 1, wherein the cover comprises a transparent region,
wherein the transparent region extends in such a way that when the cover is fastened to the electronic module by the fastening device and the first electrical plug is connected to the first electrical terminal of the electronic module, at least the cable clamp of the first electrical plug is visible, the transparent region extending over the entire cover.

7. The process automation field device of claim 1, wherein the fastening device comprises an elastic hook and a hook opening complementary to the elastic hook,
wherein the cover comprises the elastic hook and the electronic module comprises the hook opening or wherein the cover comprises the hook opening and the electronic module comprises the elastic hook.

8. The process automation field device of claim 1, wherein the field device furthermore comprises a second electrical plug with a cable clamp for receiving a cable core,
wherein the second electrical plug is adapted to be detachably connected to a second electrical terminal of the electronic module,
wherein the cover comprises at least one partition,
wherein the partition is arranged in such a way that when the cover is fastened to the electronic module by the fastening device and the second electrical plug is connected to the second electrical terminal of the electronic module, the cover, together with the electronic module, forms a first chamber and encloses the first electrical plug in the first chamber and also forms a second chamber and encloses the second electrical plug in the second chamber, wherein the first chamber is separated from the second chamber by the partition, wherein the clamping element is arranged in such a way that the clamping element prevents the second electrical plug from detaching from the second electrical terminal of the electronic module.

9. The process automation field device of claim 1, wherein the cover is designed in such a way that into the cover has a text or pictograms, wherein the text or the pictograms are formed by means of laser marking, engraving, or pad printing.

* * * * *